United States Patent
He et al.

(10) Patent No.: US 10,109,356 B2
(45) Date of Patent: Oct. 23, 2018

(54) METHOD AND APPARATUS FOR STRESSING A NON-VOLATILE MEMORY

(71) Applicant: FREESCALE SEMICONDUCTOR, INC., Austin, TX (US)

(72) Inventors: Chen He, Austin, TX (US); Richard K. Eguchi, Austin, TX (US); Fuchen Mu, Austin, TX (US); Benjamin A. Schmid, Austin, TX (US); Craig T. Swift, Austin, TX (US); Yanzhuo Wang, Austin, TX (US)

(73) Assignee: NXP USA, INC., Austin, TX (US)

( * ) Notice: Subject to any disclaimer, the term of this patent is extended or adjusted under 35 U.S.C. 154(b) by 81 days.

(21) Appl. No.: 14/631,365

(22) Filed: Feb. 25, 2015

(65) Prior Publication Data

US 2016/0247574 A1    Aug. 25, 2016

(51) Int. Cl.

| | | |
|---|---|---|
| *G11C 16/14* | (2006.01) | |
| *G11C 29/02* | (2006.01) | |
| *G11C 29/06* | (2006.01) | |
| G11C 16/04 | (2006.01) | |
| G11C 29/50 | (2006.01) | |

(52) U.S. Cl.
CPC ............ *G11C 16/14* (2013.01); *G11C 29/028* (2013.01); *G11C 29/06* (2013.01); *G11C 16/0408* (2013.01); *G11C 16/0466* (2013.01); *G11C 2029/5004* (2013.01)

(58) Field of Classification Search
CPC .. G11C 16/14; G11C 16/0408; G11C 16/0466
USPC ........................................ 365/185.19, 185.01
See application file for complete search history.

(56) References Cited

U.S. PATENT DOCUMENTS

| | | | | |
|---|---|---|---|---|
| 5,982,670 A | * | 11/1999 | Yamashita | ......... G11C 16/3445 365/185.22 |
| 6,426,898 B1 | | 7/2002 | Mihnea et al. | |
| 6,438,037 B1 | * | 8/2002 | Fastow | ............. G11C 16/3404 365/185.22 |
| 6,493,280 B2 | | 12/2002 | Mihnea et al. | |
| 6,606,273 B1 | * | 8/2003 | Guo | ..................... G11C 29/006 365/185.24 |
| 8,432,752 B2 | | 4/2013 | Eguchi et al. | |
| 2001/0010648 A1 | * | 8/2001 | Kurosaki | ............... G11C 16/16 365/185.29 |
| 2004/0032774 A1 | * | 2/2004 | Hirano | ................ G11C 11/5628 365/202 |

(Continued)

OTHER PUBLICATIONS

Inoue et al., Nand Flash Applications Design Guide, 2013, Toshiba, p. 7.*

*Primary Examiner* — T. Bui
*Assistant Examiner* — Alfredo Bermudez Lozada

(57) ABSTRACT

A method and memory for stressing a plurality of non-volatile memory cells is provided. The method includes entering a memory cell stressing mode and providing one or more erase stress pulses to the plurality of non-volatile memory cells; determining that a threshold voltage of at least a subset of the plurality of non-volatile memory cells has a first relationship that is either greater than or less than a first predetermined voltage; providing one or more program stress pulses to the plurality of memory cells; and determining that the threshold voltage of at least a subset of the plurality of memory cells has a second relationship to a second predetermined voltage that is different than the first relationship.

20 Claims, 4 Drawing Sheets

(56) References Cited

U.S. PATENT DOCUMENTS

2010/0172188 A1* 7/2010 Chen ............... G11C 16/3404
365/185.22
2013/0194874 A1 8/2013 Mu et al.

* cited by examiner

METHOD AND APPARATUS FOR STRESSING A NON-VOLATILE MEMORY

BACKGROUND

Field

This disclosure relates in general to non-volatile memories (NVM), and more specifically, to a system and method for improved NVM reliability.

Related Art

As technology advances and feature sizes of non-volatile memory (NVM) cells become smaller, manufacturers are challenged with improved NVM product reliability. NVMs may include erasable programmable read only memories (EPROMs), electrically erasable programmable read only memories (EEPROMs), block erasable EEPROMs (e.g., "Flash" memories), and the like. NVMs are expected to endure repeated program and erase cycles and are expected to retain data for years. Conventional testing is typically used to identify and weed out manufacturing defects. However, NVMs with smaller geometries are more susceptible to manufacturing variability and therefore, look to more advanced methods and systems for addressing NVM reliability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
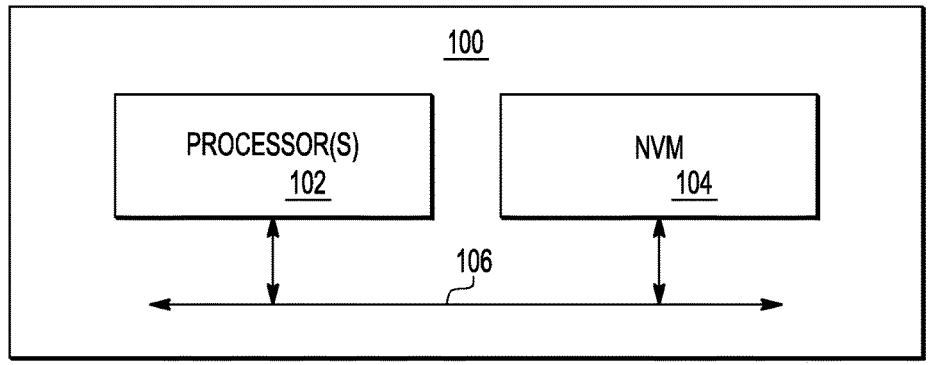
FIG. 1 is a block diagram of an integrated circuit including a non-volatile memory (NVM) in accordance with an embodiment of the present disclosure.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present disclosure describes a high-voltage stress method and system for non-volatile memories. In an embodiment of the present disclosure, stress gate and well bias between an erase stress mode and a program stress mode based on bit cell threshold voltage may be adaptively adjusted to reduce risk of over-stressing the dielectric layers of NVM cells and improve effectiveness of tunnel oxide stress.

Generally, there is provided, a method for stressing a plurality of non-volatile memory cells, the method includes: entering a memory cell stressing mode; providing one or more erase stress pulses to the plurality of non-volatile memory cells; determining that a threshold voltage of at least a subset of the plurality of non-volatile memory cells has a first relationship that is either greater than or less than a first predetermined voltage; providing one or more program stress pulses to the plurality of memory cells; and determining that the threshold voltage of at least a subset of the plurality of memory cells has a second relationship to a second predetermined voltage that is different than the first relationship. The method may further include determining that the first relationship is less than the first predetermined voltage. The method may further include determining that the threshold voltage is not less than the first predetermined voltage, and in response, providing additional erase stress pulses to the plurality of non-volatile memory cells. The method may further include determining that the second relationship is greater than the second predetermined voltage. The method may further include determining that the threshold voltage is not greater than the second predetermined voltage, and in response, providing additional program stress pulses to the plurality of non-volatile memory cells. The method may further include setting a maximum number of erase stress pulses and a maximum number of program stress pulses to be applied to the plurality of memory cells. The method may further include providing one or more erase stress pulses with a predetermined duration such that an electric field of the plurality of non-volatile memory cells is below a dielectric conduction electric field of an insulating layer between a control gate and a charge storage layer of the plurality of non-volatile memory cells. The providing one or more erase stress pulses may include providing a negative voltage to a control gate that has a magnitude greater than a magnitude of a normal erase voltage, providing a positive voltage to a well terminal that has a magnitude greater than a magnitude of the normal erase voltage, and floating the source and drain terminals, and wherein providing one or more program stress pulses includes providing a first positive voltage to the control gate, providing a second positive voltage to the drain terminal, and coupling both the source terminal and the well terminal to ground. The first predetermined voltage and the second predetermined voltage may be the same and may be substantially less than a normal erase verify voltage.

In one embodiment, there is provided, a method for stressing a plurality of non-volatile memory cells, the method includes: entering a memory cell stressing mode; providing a plurality of erase stress pulses to the plurality of non-volatile memory cells; determining that a threshold voltage of at least a subset of the plurality of non-volatile memory cells has a first relationship that is either greater than or less than a predetermined voltage; providing one or more program stress pulses to the plurality of memory cells; and determining that the threshold voltage of at least a subset of the plurality of memory cells has a second relationship to the predetermined voltage that is different than the first relationship. The method may further include setting a maximum number of erase stress pulses and a maximum number of program stress pulses to be applied to the plurality of memory cells. The method may further include determining that the first relationship is less than the predetermined voltage. The method may further include determining that the second relationship is greater than the predetermined voltage. Each of the plurality of non-volatile memory cells may include a control gate, a charge storage layer, a source terminal, a drain terminal, and a well terminal. Providing one or more erase stress pulses may include providing a negative voltage to the control gate that has a magnitude greater than a magnitude of a normal erase voltage, providing a positive voltage to the well terminal that has a magnitude greater than a magnitude of the normal erase voltage, and floating the source and drain terminals, and wherein providing one or more program stress pulses includes providing a first positive voltage to the control gate, providing a second positive voltage to the drain terminal, and coupling the source terminal and the well terminal to ground.

In another embodiment, there is provided, a non-volatile memory may include: a plurality of non-volatile memory cells; and a non-volatile memory controller coupled to the plurality of non-volatile memory cells. The non-volatile memory controller may have a stressing mode for stressing the plurality of non-volatile memory cells by causing one or more erase stress pulses to be provided to the plurality of memory cells. The memory controller may determine that a threshold voltage of at least a subset of the plurality of non-volatile memory cells has a first relationship that is either greater than or less than a first predetermined voltage. The memory controller may provide one or more program stress pulses to the plurality of memory cells, and the memory controller may determine that the threshold voltage of at least a subset of the plurality of memory cells has a second relationship to a second predetermined voltage that is different than the first relationship. Each of the plurality of non-volatile memory cells may include a control gate, a charge storage layer, a source terminal, a drain terminal, and a well terminal. The charge storage layer may include one of either a floating gate, a nitride layer for trapping charge, or a plurality of discrete charge traps. The first predetermined voltage may be equal to the second predetermined voltage. One or more erase stress pulses may include providing a negative voltage to the control gate that has a magnitude greater than a magnitude of a normal erase voltage, providing a positive voltage to well terminal that has a magnitude greater than a magnitude of the normal erase voltage, and floating the source and drain terminals, and wherein the one or more program stress pulses includes providing a first positive voltage to the control gate, providing a second positive voltage to the drain terminal, and coupling both the source terminal and the well terminal to ground.

FIG. 1 is a block diagram of an integrated circuit (IC) 100 including a non-volatile memory (NVM) 104 according to one embodiment. In the illustrated embodiment, the IC 100 may implement as a system on a chip (SOC) or the like which includes at least one processor 102 coupled to the NVM 104 via an appropriate interface 106, such as a bus or the like with multiple signals or bits. The IC 100 may include other circuits, modules or devices, such as other memory devices (not shown), other functional modules (not shown), and external interfaces, such as input, output or input/output (I/O) ports or pins or the like (not shown). In one alternative embodiment, the NVM 104 is integrated on the IC 100 alone without any other devices. In another alternative embodiment, the processor 102, NVM 104 and interface 106 are part of a larger system on the IC 100.

Figure 2:
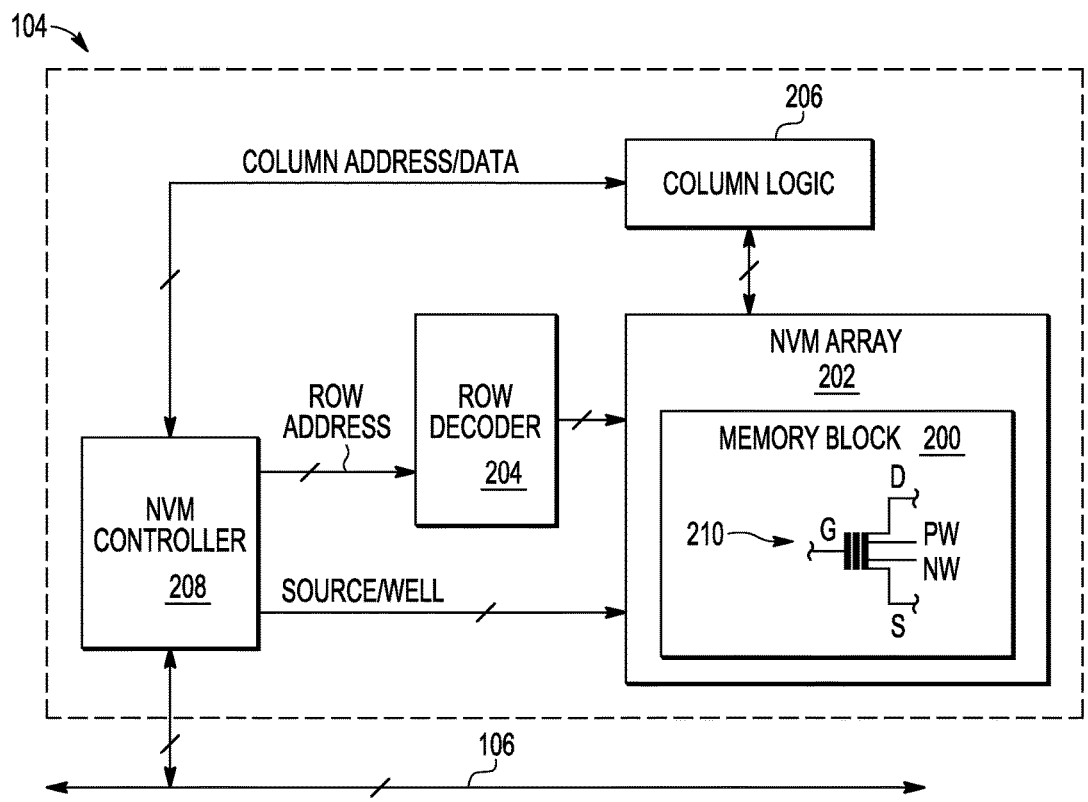
FIG. 2 is a more detailed block diagram of the NVM in FIG. 1 in accordance with an embodiment of the present disclosure.

FIG. 2 is a more detailed block diagram of the NVM 104 according to one embodiment coupled to the interface 106. The NVM 104 includes an NVM array 202, a row decoder 204 coupled to the NVM array 202, column logic 206 coupled to the NVM array 202, and a memory controller 208 coupled to the interface 106, the column logic 206, and the row decoder 204. The column logic 206 incorporates a column decoder and sense amplifiers (not shown) and each interface is shown with multiple signals or bits. The memory controller 208 controls operation of the NVM array 202 through the row decoder 204 and the column logic 206, such as in response to the processor(s) 102 as communicated through the interface 106 or other interfaces. The memory controller 208 accesses memory cells within the NVM array 202 by providing a row address to the row decoder 204 and a column address to the column logic 206. Data is written into or read from the NVM array 202 via the column logic 206. The memory controller 208 also drives source and well voltages (via corresponding switches and controllers, not shown) to the NVM array 202. The NVM array 202 incorporates one or more blocks of memory cells in which each memory block has a selected block size, such as, for example, 16 kilobytes (kB), 32 kB, 64 kB, 128 kB, 256 kB, etc. As shown, the NVM array 202 includes at least one memory block 200.

Shown within the memory block 200 of the NVM array 202 is an exemplary memory cell 210 having a gate (G) terminal, a drain (D) terminal and a source (S) terminal along with isolated wells including a p-well (PW) and an n-well (NW). The terms memory bit cell, bit cell, bit, and the like as used herein, refer to memory cell 210. In one embodiment, each memory block is organized into rows and columns of the memory cells 210. The gate terminal of each row of memory cells 210 is coupled to a corresponding one of multiple wordlines coupled to the row decoder 204. The drain terminal of each column of memory cells 210 is coupled to a corresponding one of multiple bit lines coupled to the column logic 206. The source terminal and wells (PW and NW) of each memory cell 210 are driven or controlled by the memory controller 208. In one embodiment, the memory controller 208 drives individual voltage levels to PW and NW.

The memory cells 210 are implemented according to any one of several configurations, such as semiconductor configurations, layered silicon-metal nanocrystals, etc. In one embodiment, each memory cell 210 is implemented on a silicon substrate or the like. In one embodiment, the p-well of each memory cell 210 is isolated from a P substrate with an n-well. A pair of n+ type doped regions (not shown) is formed in the p-well forming the drain and source terminals of each memory cell 210. Each memory cell 210 further includes a stacked gate structure or the like, including an oxide layer (not shown) formed on the p-well, a floating gate (not shown) provided on the oxide layer, a dielectric layer (not shown) provided on the floating gate, and a control gate (not shown) provided on the dielectric layer forming a gate terminal. The p-well is generally coupled to a ground voltage Vss and the n-well is generally coupled to a supply voltage Vdd. In one embodiment, the n-well may be coupled to a different supply or allowed to electrically float during program or erase procedures. The voltage level of Vdd depends upon the particular implementation or process node. In one embodiment, Vdd is approximately 3.3 Volts (V).

In one embodiment, when an erase pulse is applied to the memory cell 210 during an erase operation, the p-well and n-well of the memory cell 210 are coupled or otherwise driven together to collectively receive an erase pulse voltage. As described herein, an "erase pulse" is said to be applied to each memory cell 210 of the memory block 200 in which the gate terminal is driven to a selected erase pulse voltage and in which the p-well and n-well collectively receive a different erase pulse voltage.

Figure 3:
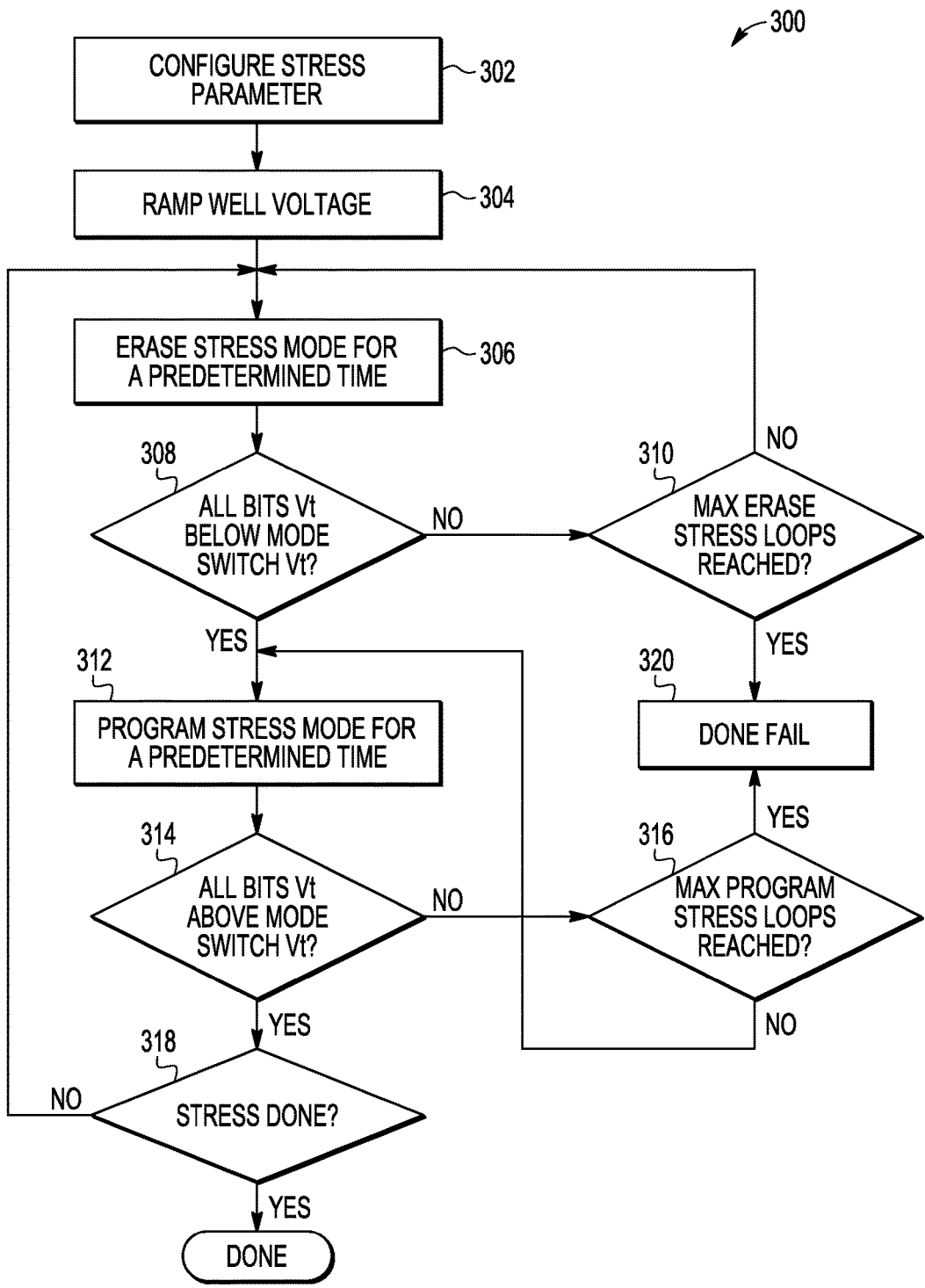
FIG. 3 is a simplified flow diagram of erase and program stress operations in accordance with an embodiment of the present disclosure.

FIG. 3 is a simplified flowchart diagram of an NVM stress method generally controlled by the memory controller 208 in accordance with one embodiment of the present disclosure. The stress method includes two modes of operation, an erase stress mode and a program stress mode. It is understood that the erase stress mode operation is performed on the NVM array 202, such as the entire NVM array 202, or any selected one or more memory blocks thereof, although described herein as being applied to the memory block 200. It is also understood that the program stress mode operation is performed on the NVM array 202, generally on a collection or group of cells organized such as bytes, words, blocks, pages or the like, or the entire NVM array 202.

Figure 4:
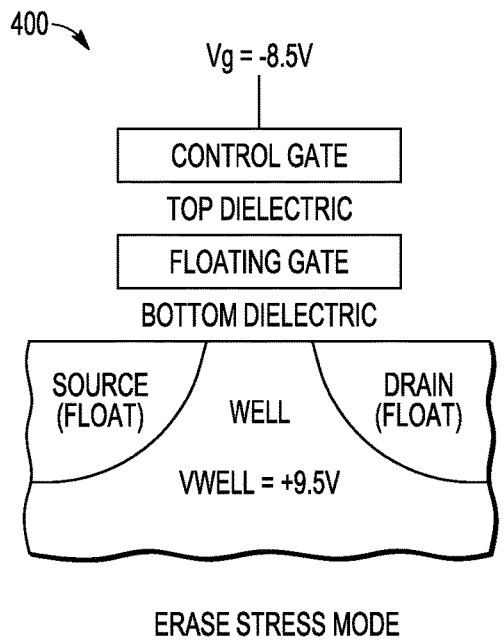
FIG. 4 is a simplified cross-sectional diagram of an NVM bit cell with exemplary erase stress voltages applied in accordance with an embodiment of the present disclosure.

FIG. 4 is a diagram illustrating a simplified cross-sectional view 400 of the memory cell 210 of the memory block 200 in accordance with an embodiment of the present disclosure during an erase stress mode operation. In this diagram, a floating gate NVM cell is depicted. The floating gate NVM cell shown is a stacked-gate structure having a top dielectric which isolates a control gate from a floating gate and a bottom dielectric which isolates the floating gate from a substrate. Source and drain regions form a channel in the well of the substrate. In one embodiment, the top dielectric may be formed as an oxide-nitride-oxide (ONO) dielectric, or the like. In one embodiment, the bottom dielectric may be formed as an oxide, or the like. In one embodiment, the control gate and floating gate may include a polysilicon material. During the erase stress mode operation, the source, drain, gate, and well terminals of the memory cells 210 are configured with the control gate voltage Vg at −8.5 volts, the source and drain nodes are electrically floating, and the well voltage Vwell at 9.5 volts.

Figure 5:
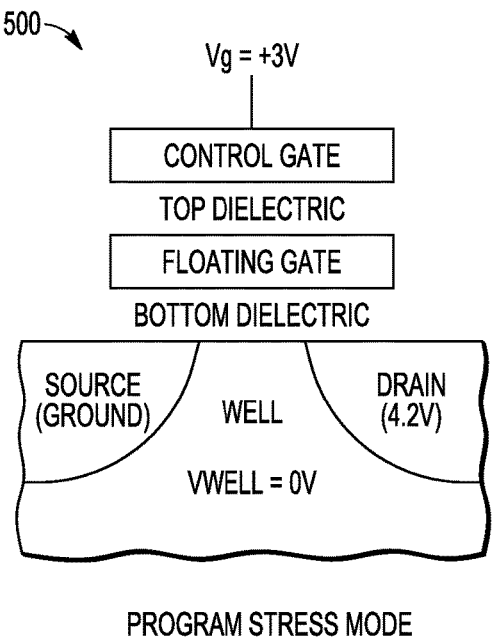
FIG. 5 is a simplified cross-sectional diagram of an NVM bit cell with exemplary program stress voltages applied in accordance with an embodiment of the present disclosure.

FIG. 5 is a diagram illustrating a simplified cross-sectional view 500 of the memory cell 210 of the memory block 200 in accordance with an embodiment of the present disclosure during a program stress mode operation. In this diagram, the floating gate NVM cell is depicted having the source, drain, gate, and well terminals of the memory cells 210 configured with the control gate voltage Vg at 3 volts, the source node at ground or Vss, the drain node at 4.2 volts, and the well voltage Vwell at 0 volts.

Figure 6:
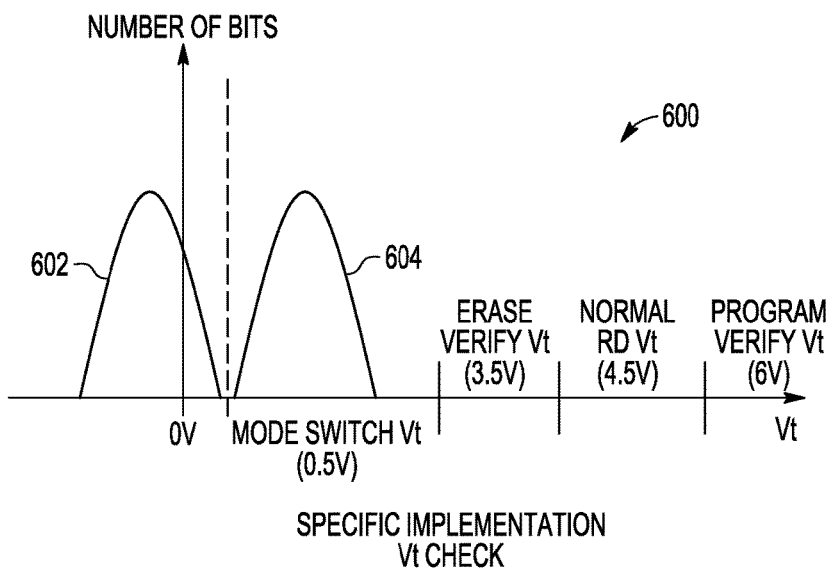
FIG. 6 is a simplified graph illustrating threshold voltage (Vt) distributions of NVM bit cells in accordance with an embodiment of the present disclosure.

FIG. 6 is a diagram illustrating distributions of threshold voltages (Vt) of memory cells 210 in accordance with an embodiment of the present disclosure. In a first Vt distribution 602 of memory cells 210, the bit cells having a Vt below or lower (to the left of) than the Mode Switch Vt (vertical dashed line) are characterized as erased bits. In a second Vt distribution 604 of memory cells 210, the bit cells having a Vt above or higher than the Mode Switch Vt are characterized as programmed bits.

Referring again to FIG. 3, at step 302, parameters of the NVM stress are configured. For example, configured parameters may include erase stress duration, program stress duration, maximum number of erase stress pulses, maximum number of program stress pulses, voltage settings for the memory cells 210 during the erase stress and program stress such as those shown in FIGS. 4 and 5 respectively.

At step 304, the p-well voltage to the memory cells 210 is ramped up to a predetermined value with successive erase pulses. The pulses are applied in such a manner as to avoid dielectric damage of the memory cells 210. In some embodiments, an exemplary NVM technology is considered in which the erase ramp pulse voltage is applied to the p-wells and n-wells of the memory cells while the gate terminals receive an erase pulse voltage having a substantially fixed magnitude. In alternative embodiments, such as those using other NVM technologies and the like, the erase ramp pulse voltage is instead applied to a different connection or terminal of the memory cells being erased, such as the gate terminal or the like.

At step 306, the erase stress mode is entered and the erase stress is performed on the memory cells 210 based on the configured stress parameters at step 302. The erase stress includes elevated biases applied to memory cells 210, with longer duration relative to a normal operational erase operation. The erase stress may include one or more erase pulses at one or more predetermined voltage conditions over a predetermined duration. The erase stress may be performed as a bulk erase stress. For example, all memory cells 210 of selected memory block(s) 200 may be erase stressed concurrently. In this embodiment, the gate node of each memory cell 210 is biased at −8.5V, and the well of each bit cell is biased at 9.5V, while the drain and source nodes of each bit cell are floating. In one embodiment, when an erase stress is applied to the memory cells 210, the p-well and n-well of the memory cells 210 may be coupled or otherwise driven together to collectively receive an erase stress voltage.

At step 308, determine whether the threshold voltages of all of the memory cells 210 are below the Mode Switch threshold voltage. If the threshold voltages of all memory cells 210 are lower than the Mode Switch threshold voltage (yes), continue at step 312. If the threshold voltages of all memory cells 210 are not lower than the Mode Switch threshold voltage (no), then at step 310, determine whether a maximum number of erase stress loops has been reached.

At step 310, if the maximum number of erase stress loops has been reached (yes), then a failure is indicated at step 320 and the operation is ended. If the maximum number of erase stress loops has not been reached (no), then return at step 306.

At step 312, the program stress mode is entered and the program stress is performed on the memory cells 210 based on the configured stress parameters at step 302. The program stress may include one or more program pulses at one or more predetermined voltage conditions over a predetermined duration. The program stress may be performed on memory cells 210 on a page by page basis. For example, the gate node of each memory cell 210 in a selected page to be stressed may be biased at a positive voltage, 3V, and the drain node of each memory cell 210 in the selected page may be biased at a positive voltage, 4.8V, while the source and well of the memory cells 210 in the selected page may be grounded. The gate of memory cells 210 in unselected pages may be biased at a negative voltage, 4.2V.

At step 314, determine whether the threshold voltages of all of the memory cells 210 are above the Mode Switch threshold voltage. If the threshold voltages of all memory cells 210 are higher than the Mode Switch threshold voltage (yes), then at step 318, determine whether a predetermined amount of stressing is complete. If the threshold voltages of all memory cells 210 are not higher than the Mode Switch threshold voltage (no), then at step 316, determine whether a maximum number of program stress loops has been reached.

At step 316, if the maximum number of program stress loops has been reached (yes), then a failure is indicated at step 320 and the operation is ended. If the maximum number of erase stress loops has not been reached (no), then return at step 312.

At step 318, if the predetermined amount of erase stress and program stress has been reached (yes), then the operation is completed. If the predetermined amount of erase stress and program stress has not been reached (no), then return at step 306.

Figure 7:
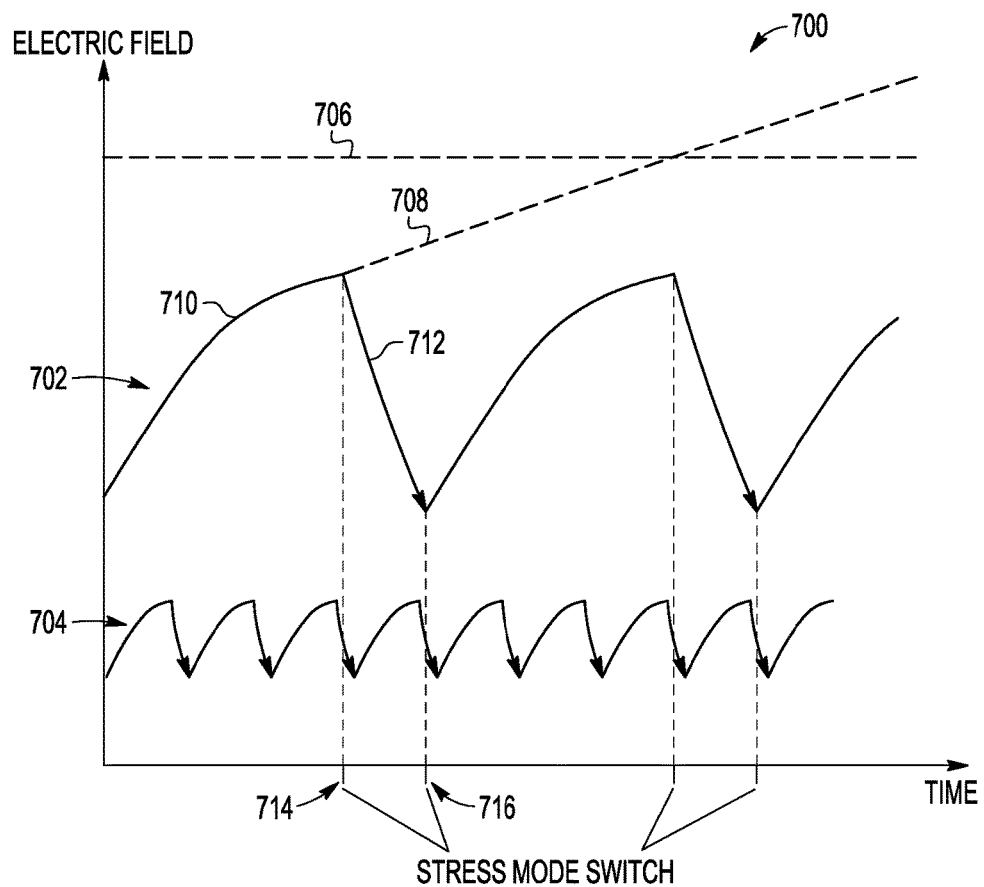
FIG. 7 is a simplified graph illustrating electric field versus time for high voltage stress of NVM bit cells in accordance with an embodiment of the present disclosure.

FIG. 7 is a simplified graph 700 illustrating electric field versus time for high voltage stress of memory cells 210. Waveform 702 illustrates an electric field profile in accordance with an embodiment of the present disclosure wherein an adaptively adjusted erase and program stress on memory cells 210 may be based on Vt. A first repeating portion 710 of waveform 702 illustrates the electric field, between a control gate and a charge storage layer of memory cells 210, reaching a peak value according to a predetermined duration of one or more erase stress pulses. The peak electric field value reached by waveform portion 710 is less than a dielectric conduction electric field value of the memory cells 210 shown at dashed line 706. It may be desirable for the peak electric field value of waveform portion 710 to reach relatively close to but without actually reaching the dielectric conduction shown at dashed line 706. A second repeating portion of waveform 702, arrow 712, indicates a recovery period of program stressing initiated when all of the Vts of memory cells 210 are determined to be lower than Mode Switch threshold 714 (vertical dashed line). The recovery period ends program stress when all of the Vts of memory cells 210 are determined to be higher than Mode Switch threshold 716 (vertical dashed line).

In contrast, an undesirable erase stress may begin with the electric field increasing (e.g. waveform portion 710) and continuing to increase crossing the dielectric conduction electric field value 706 as shown in dashed line portion 708. When the electric field during an erase stress is beyond the dielectric conduction 706, saturation occurs causing unwanted dielectric conduction between the control gate and the charge storage layer of memory cells 210. Prolonged conduction increases the risk of damaging the dielectric structure of memory cells 210.

Waveform 704 illustrates an electric field profile according to normal erase and program operation of memory cells 210. The magnitude of electric fields associated with normal erase and program operations is much less than those associated with erase stress and program stress operations. Therefore, normal erase and program operations may not be effective for intentionally stressing the bit cells.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under," "above," "below," and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different memory systems. For example, although FIG. 1 and the discussion thereof describe an exemplary memory architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for stressing a plurality of non-volatile memory cells, the method comprising:
    entering an erase stress mode of the plurality of non-volatile memory cells;
    during the erase stress mode:
        providing one or more erase stress pulses to the plurality of non-volatile memory cells; and
        determining that a threshold voltage of a predetermined plurality of non-volatile memory cells has a first relationship that is either greater than or less than a first predetermined voltage, the first predetermined voltage being substantially less than a normal erase verify voltage, wherein the threshold voltage is lower than the normal erase verify voltage during the erase stress mode;
    entering a recovery period of program stressing of the plurality of non-volatile memory cells in response to determining that the threshold voltage of the predetermined non-volatile memory cells has the first relationship with the predetermined voltage;
    during the recovery period of program stressing:
        providing one or more program stress pulses to the plurality of memory cells; and
        determining that the threshold voltage of at least a subset of the plurality of memory cells has a second relationship with the first predetermined voltage that is different than the first relationship, wherein the threshold voltage is lower than the normal erase verify voltage during the recovery period;
    determining whether a predetermined amount of erase stress and program stress has been reached in response to determining that the threshold voltage of the predetermined non-volatile memory cells has the second relationship with the predetermined voltage;
    entering the erase stress mode of the plurality of non-volatile memory cells in response to determining that the predetermined amount of erase stress and program stress has not been reached;
    during the erase stress mode:
        providing one or more erase stress pulses to the plurality of non-volatile memory cells.

2. The method of claim 1, wherein determining that a threshold voltage of the predetermined plurality of non-volatile memory cells has a first relationship further comprising determining that the first relationship is less than the first predetermined voltage.

3. The method of claim 2, further comprising determining that the threshold voltage is not less than the first predetermined voltage, and in response, providing additional erase stress pulses to the plurality of non-volatile memory cells.

4. The method of claim 1, wherein determining that the threshold voltage of the predetermined plurality of memory cells has a second relationship further comprising determining that the second relationship is greater than the first predetermined voltage.

5. The method of claim 4, further comprising determining that the threshold voltage is not greater than the first predetermined voltage, and in response, providing additional program stress pulses to the plurality of non-volatile memory cells.

6. The method of claim 1, further comprising setting a maximum number of erase stress pulses and a maximum number of program stress pulses to be applied to the plurality of memory cells.

7. The method of claim 1, wherein providing one or more erase stress pulses to the plurality of memory cells further comprises providing one or more erase stress pulses with a predetermined duration such that an electric field of the plurality of non-volatile memory cells is below a dielectric conduction electric field of an insulating layer between a control gate and a charge storage layer of the plurality of non-volatile memory cells.

8. The method of claim 1, wherein providing one or more erase stress pulses comprises providing a negative voltage to a control gate that has a magnitude greater than a magnitude of a normal erase voltage, providing a positive voltage to a well terminal that has a magnitude greater than a magnitude of the normal erase voltage, and floating the source and drain terminals, and wherein providing one or more program stress pulses comprises providing a first positive voltage to the control gate, providing a second positive voltage to the drain terminal, and coupling both the source terminal and the well terminal to ground.

9. The method of claim 1, wherein each erase stress pulse of the one or more erase stress pulses to the plurality of memory cells comprises:
    providing −8.5 volts to control gates of the plurality of memory cells; and
    providing 9.5 volts to wells of the plurality of memory cells.

10. The method of claim 9, wherein each one of the program stress pulses of the one or more program stress pulses to the plurality of memory cells comprises:
    providing 3 volts to the control gates of the plurality of memory cells;
    providing 4.2 volts to drain nodes of the plurality of memory cells; and
    providing 0 volts to the wells of the plurality of memory cells.

11. The method of claim 1, further comprising:
determining that the threshold voltage of at least a subset of the plurality of memory cells is substantially less than the normal erase verify voltage after the program stress mode.

12. A method for stressing a plurality of non-volatile memory cells, the method comprising:
entering an erase stress mode of the plurality of non-volatile memory cells;
during the erase stress mode:
providing a plurality of erase stress pulses to the plurality of non-volatile memory cells; and
determining that a threshold voltage of a predetermined plurality of non-volatile memory cells has a first relationship that is either greater than or less than a predetermined voltage, the predetermined voltage being substantially less than a normal erase verify voltage, wherein the threshold voltage is lower than the normal erase verify voltage during the erase stress mode;
entering a program stress mode of the plurality of non-volatile memory cells in response to determining that the threshold voltage of the predetermined non-volatile memory cells has the first relationship to the predetermined voltage; and
during the program stress mode:
providing one or more program stress pulses to the plurality of memory cells;
determining that the threshold voltage of the predetermined plurality of memory cells has a second relationship to the predetermined voltage that is different than the first relationship, wherein the threshold voltage is lower than the normal erase verify voltage during a recovery period;
determining whether a predetermined amount of erase stress and program stress has been reached in response to determining that the threshold voltage of the predetermined non-volatile memory cells has the second relationship with the predetermined voltage;
entering the erase stress mode of the plurality of non-volatile memory cells in response to determining that the predetermined amount of erase stress and program stress has not been reached; and
during the erase stress mode:
providing one or more erase stress pulses to the plurality of non-volatile memory cells; and
determining that the threshold voltage of the predetermined plurality of non-volatile memory cells has the first relationship with the first predetermined voltage; and
entering the recovery period of program stressing of the plurality of non-volatile memory cells in response to determining that the threshold voltage of the predetermined non-volatile memory cells has the first relationship with the predetermined voltage.

13. The method of claim 12, further comprising setting a maximum number of erase stress pulses and a maximum number of program stress pulses to be applied to the plurality of memory cells.

14. The method of claim 12, wherein determining that a threshold voltage of the predetermined plurality of non-voltage memory cells has a first relationship further comprises determining that the first relationship is less than the predetermined voltage.

15. The method of claim 12, wherein determining that the threshold voltage of the predetermined plurality of memory cells has a second relationship further comprises determining that the second relationship is greater than the predetermined voltage.

16. The method of claim 12, wherein each of the plurality of non-volatile memory cells comprises a control gate, a charge storage layer, a source terminal, a drain terminal, and a well terminal.

17. The method of claim 16, wherein providing one or more erase stress pulses comprises providing a negative voltage to the control gate that has a magnitude greater than a magnitude of a normal erase voltage, providing a positive voltage to the well terminal that has a magnitude greater than a magnitude of the normal erase voltage, and floating the source and drain terminals, and wherein providing one or more program stress pulses comprises providing a first positive voltage to the control gate, providing a second positive voltage to the drain terminal, and coupling the source terminal and the well terminal to ground.

18. A non-volatile memory comprising:
a plurality of non-volatile memory cells; and
a non-volatile memory controller coupled to the plurality of non-volatile memory cells, the non-volatile memory controller having a erase stress mode to stress the plurality of non-volatile memory cells by causing one or more erase stress pulses to be provided to the plurality of memory cells, the memory controller to determine that a threshold voltage of predetermined plurality of non-volatile memory cells has a first relationship that is either greater than or less than a first predetermined voltage, the first predetermined voltage being substantially less than a normal erase verify voltage, wherein the threshold voltage is lower than the normal erase verify voltage during the erase stress mode, the memory controller to enter a program stress mode in response to the threshold voltage of the predetermined plurality of non-volatile memory cells having the first relationship to the first predetermined voltage, to provide one or more program stress pulses to the plurality of memory cells during the program stress mode; and the memory controller to determine that the threshold voltage of at least a subset of the plurality of memory cells has a second relationship to the first predetermined voltage that is different than the first relationship during the program stress mode, wherein the threshold voltage is lower than the normal erase verify voltage during a recovery period, to determine whether a predetermined amount of erase stress and program stress has been reached in response to determining that the threshold voltage of the predetermined non-volatile memory cells has the second relationship with the predetermined voltage, and to entering the erase stress mode of the plurality of non-volatile memory cells in response to determining that the predetermined amount of erase stress and program stress has not been reached.

19. The non-volatile memory of claim 18, wherein each of the plurality of non-volatile memory cells comprises a control gate, a charge storage layer, a source terminal, a drain terminal, and a well terminal.

20. The non-volatile memory of claim 18, wherein the one or more erase stress pulses comprises providing a negative voltage to the control gate that has a magnitude greater than a magnitude of a normal erase voltage, providing a positive voltage to well terminal that has a magnitude greater than a magnitude of the normal erase voltage, and floating the source and drain terminals, and wherein the one or more program stress pulses comprises providing a first positive voltage to the control gate, providing a second positive voltage to the drain terminal, and coupling both the source terminal and the well terminal to ground.

\* \* \* \* \*